(12) United States Patent
Huang et al.

(10) Patent No.: US 11,018,318 B2
(45) Date of Patent: May 25, 2021

(54) DISPLAY PANEL AND MANUFACTURING METHOD THEREOF

(71) Applicants: Wuhan China Star Optoelectronics Semiconductor Display Technology Co., Ltd., Hubei (CN); HUAZHONG UNIVERSITY OF SCIENCE AND TECHNOLOGY, Hubei (CN)

(72) Inventors: Jing Huang, Guangdong (CN); Hsiang Lun Hsu, Guangdong (CN)

(73) Assignees: WUHAN CHINA STAR OPTOELECTRONICS SEMICONDUCTOR DISPLAY TECHNOLOGY CO., LTD., Hubei (CN); HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 219 days.

(21) Appl. No.: 16/321,551

(22) PCT Filed: Jun. 7, 2018

(86) PCT No.: PCT/CN2018/090314
§ 371 (c)(1),
(2) Date: Jan. 29, 2019

(87) PCT Pub. No.: WO2019/205234
PCT Pub. Date: Oct. 31, 2019

(65) Prior Publication Data
US 2021/0057674 A1 Feb. 25, 2021

(30) Foreign Application Priority Data

Apr. 28, 2018 (CN) .......................... 201810412136.1

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01)

(58) Field of Classification Search
CPC . H01L 51/5253; H01L 51/56; H01L 51/5259; H01L 2251/5369; H01L 2251/5338
See application file for complete search history.

(56) References Cited

U.S. PATENT DOCUMENTS

2006/0038176 A1* 2/2006 Akimoto ........... G02F 1/136286
257/59
2011/0140163 A1 6/2011 Oh et al.
(Continued)

FOREIGN PATENT DOCUMENTS

| CN | 101326858 A | 12/2008 |
|---|---|---|
| CN | 101894919 A | 11/2010 |

(Continued)

OTHER PUBLICATIONS

International search report dated Jan. 16, 2019 from corresponding application No. PCT/CN2018/090314.

*Primary Examiner* — Caridad Everhart
(74) *Attorney, Agent, or Firm* — Hauptman Ham, LLP

(57) ABSTRACT

The present application provides a display panel comprising a substrate, a light-emitting device disposed on the substrate, a first inorganic layer and a second inorganic layer sequentially covering the light-emitting device; wherein the density of the second inorganic layer is larger than that of the first inorganic layer, so as to improve the barrier properties against water and oxygen of the display panel. The present application further provides a manufacturing method of a (Continued)

display panel. The encapsulation for the display panel can be improved in the present application.

8 Claims, 3 Drawing Sheets

(56) References Cited

U.S. PATENT DOCUMENTS

| | | | | |
|---|---|---|---|---|
| 2014/0151656 A1* | 6/2014 | Zeng | ............... | C23C 16/45525 |
| | | | | 257/40 |
| 2014/0339527 A1* | 11/2014 | Lee | ............... | H01L 51/5256 |
| | | | | 257/40 |
| 2015/0086715 A1* | 3/2015 | Knaapen | ............... | C23C 16/45589 |
| | | | | 427/255.7 |
| 2016/0064691 A1* | 3/2016 | Lee | ............... | H01L 51/5275 |
| | | | | 257/40 |
| 2016/0111684 A1* | 4/2016 | Savas | ............... | C23C 16/308 |
| | | | | 257/40 |

FOREIGN PATENT DOCUMENTS

| | | | |
|---|---|---|---|
| CN | 102683381 | A | 9/2012 |
| CN | 104134756 | A | 11/2014 |
| CN | 104900681 | A | 9/2015 |
| CN | 106299153 | A | 1/2017 |
| CN | 106328671 | A | 1/2017 |
| CN | 106848087 | A | 6/2017 |
| CN | 106873839 | A | 6/2017 |
| CN | 106935726 | A | 7/2017 |

\* cited by examiner

DISPLAY PANEL AND MANUFACTURING METHOD THEREOF

RELATED APPLICATION

The present application is a National Phase of International Application Number PCT/CN2018/090314, filed Jun. 7, 2018, and claims the priority of Chinese Patent Application No. 201810412136.1, entitled display panel and manufacturing method thereof filed on Apr. 28, 2018, the disclosure of which is incorporated herein by reference.

FIELD OF THE INVENTION

The present invention relates to a display field, in particular to a display panel and a manufacturing method thereof.

BACKGROUND OF THE INVENTION

OLED (Organic Light-Emitting Diode) has the advantages of fast response, a wide range of applicable temperature, self-illumination, flexible display, etc. It is known as a third generation display technology after CRT (Cathode Ray Tube) and LCD (Liquid Crystal Display)/LED (Light-emitting Diode). The field of OLED technology has achieved extensive coverage in the display field as market demands continue to increase.

However, since organic material in the OLED display panel is particularly sensitive to external water and oxygen, the flexible encapsulating technology is directly related to the display life of the OLED, and is also one of the bottlenecks restricting the development of the OLED. At present, the flexible encapsulation mainly adopts an encapsulating structure with inorganic/organic/inorganic laminated, the encapsulating material of which is not only required to sufficiently block the invasion of external water and oxygen, but also to effectively cover particle contaminants that are unavoidable during the production process and to buffer the stress of bending and folding process. Organic buffer layer in the encapsulating structure is usually achieved by a technique such as flash evaporation, ink jet printing (IJP), and inorganic layer is usually prepared by a method of chemical vapor deposition (CVD) or physical vapor deposition (PVD). In order to prevent damage caused by high temperature to materials of electro-luminescence (EL) in the OLED display panel, the process temperature of the thin film encapsulating technology is usually below 100° C. The inorganic film obtained at the process temperature has poor film quality and many small pores. Therefore, the barrier properties against water and oxygen of the inorganic film obtained at this temperature range is relatively poor.

SUMMARY OF THE INVENTION

The present invention provides a display panel and a manufacturing method thereof, which can improve the barrier properties against water and oxygen of the display panel, and improve the encapsulation for the display panel.

In one aspect, the present invention provides a display panel comprising:
a substrate,
a light-emitting device disposed on the substrate,
a first inorganic layer and a second inorganic layer sequentially covering the light-emitting device;
wherein the density of the second inorganic layer is larger than that of the first inorganic layer, so as to improve the barrier properties against water and oxygen of the display panel.

The edge of the first inorganic layer disclosed herein exceeds the edge of the second inorganic layer.

The display panel disclosed herein further comprises an organic buffer layer and a third inorganic layer sequentially covering the second inorganic layer, and the edges of the first inorganic layer and the third inorganic layer exceed the edge of the organic buffer layer.

The edge of the second inorganic layer disclosed herein exceeds the edge of the organic buffer layer.

The edge of the organic buffer layer disclosed herein exceeds the edge of the second inorganic layer.

The second inorganic layer disclosed herein is an alumina film, and the second inorganic layer has a thickness of 0.05-0.1 um.

The display panel disclosed herein further comprises at least one of barrier walls disposed on the substrate; at least one of the barrier walls surrounds the light-emitting device; at least one of the barrier walls is covered by the first inorganic layer, the second inorganic layer and the third inorganic layer, and at least one of the barrier walls surrounds the organic buffer layer.

The first inorganic layer disclosed herein fits the substrate so that the light-emitting device is sealed between the first inorganic layer and the substrate.

In another aspect, the present invention further provides a manufacturing method of a display panel comprising:
forming a light-emitting device on the substrate, and forming a first inorganic layer on the light-emitting device by chemical vapor deposition;
forming a second inorganic layer on the first inorganic layer by spatial atomic layer deposition so that the density of the second inorganic layer is larger than that of the first inorganic layer, so as to improve the barrier properties against water and oxygen of the display panel.

The manufacturing method of the display panel further comprises:
forming an organic buffer layer on the second inorganic layer by ink jet printing or flash evaporating process;
forming a third inorganic layer on the organic buffer layer by spatial atomic layer deposition, wherein the edges of the first inorganic layer and the third inorganic layer exceed the edge of the organic buffer layer to encapsulate the organic buffer layer.

The present invention provides a display panel and a manufacturing method thereof, wherein a first inorganic layer is formed by chemical vapor deposition on a light-emitting device; the first inorganic layer is formed at a temperature range that does not damage the light-emitting device, and there are many defects, such as holes. By forming a second inorganic layer on the first inorganic layer, the second inorganic layer may form a protective layer with a density higher than that of the first inorganic layer at a temperature range that does not damage the light-emitting device since the second inorganic layer is formed by spatial atomic layer deposition, thereby preventing problems such as poor sealing of the light-emitting device caused by defects of the first inorganic layer.

BRIEF DESCRIPTION OF THE DRAWINGS

In order to illustrate implementations of present invention more clearly, the drawings according to the implementations of present invention will be introduced briefly. Apparently, hereinafter described drawings are merely a portion of implementations of present invention. For those skilled in the art, they can obtain other drawings on the base of these drawings without creative work.

DETAILED DESCRIPTION OF THE INVENTION

In order to more clearly understand the above objects, features and advantages of the present application, the following detailed description of present application will be made with reference to the accompanying drawings and specific implementations. It should be noted that implementations and characteristics thereof in the present application can be combined mutually in the case of no conflict.

Many specific details are described in the following description to fully understand the present application, but described implementations are merely a portion of implementations of present invention, rather than all of the implementations. Base on the implementations of present application, all other implementations obtained by those skilled in the art without creative work are considered to be encompassed within the scope of the present application.

In addition, the following description of various examples is provided to illustrate specific examples that may be used to implement the present application with reference to additional figures. Directional terms mentioned in the present application such as top, bottom, up, down, front, back, left, right, inside, outside, side and the like, are only directions referring to the additional figures. Therefore, the directional terms used are intended to explain and understand the application better and more clearly, rather than to indicate or imply that indicate or imply that the device or element referred to must have a specific orientation and be constructed and operated in a specific orientation, and they should not be understood as limitations on the application therefore.

Figure 1:
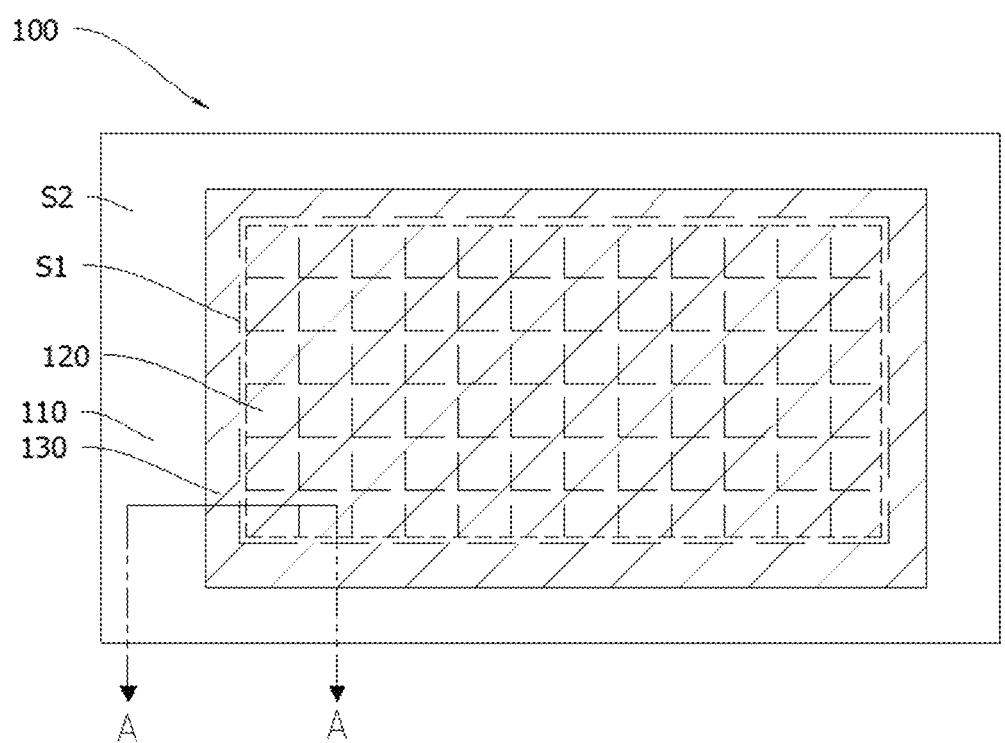
FIG. 1 is a schematic view of a display panel provided by a first implementation of the present invention.

See FIG. 1. FIG. 1 is a display panel 100 provided by an implementation of the present application, which can be used for a flexible OLED display device. Display panel 100 comprises substrate 110, light-emitting device 120, and encapsulating structure 130 used to encapsulate light-emitting device 120. Substrate 110 comprises display area S1 and peripheral area S2 disposed on peripheral side of the display area. Light-emitting device 120 is correspondingly disposed in display area S1, and is used for images display. Peripheral area S2 is provided with a driving circuit for driving light-emitting device 120 to emit light and display images. Light-emitting device 120 comprises organic light-emitting materials, such organic light-emitting materials are easily eroded by moisture and oxygen in the air to damage the organic light-emitting materials and affect the display function of display panel 100. Encapsulating structure 130 is covered on light-emitting device 120, and light-emitting device 120 is encapsulated by encapsulating structure 130 and the substrate to prevent light-emitting device 120 from being eroded by moisture and oxygen in the air.

Figure 2:
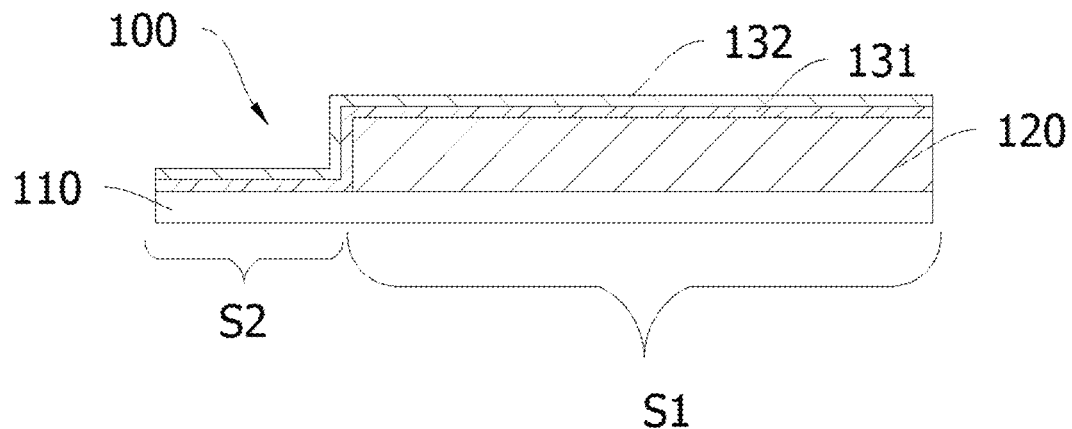
FIG. 2 is a schematic view of a display panel provided by a second implementation of the present invention.

See FIG. 2. Encapsulating structure 130 comprises first inorganic layer 131 and second inorganic layer 132 sequentially covering light-emitting device 120. First inorganic layer 131 fits substrate 110 so that light-emitting device 120 is sealed between first inorganic layer 131 and substrate 110. First inorganic layer 131 is formed by chemical vapor deposition, and second inorganic layer 132 is formed by spatial atomic layer deposition so that the density of second inorganic layer 132 is larger than that of first inorganic layer 131, so as to improve the barrier properties against water and oxygen of display panel 100.

Atomic Layer Deposition (ALD) is a technique by which materials can be plated on the surface of a substrate layer by layer in the form of a monatomic film. This allows the control of the absolutely precise thickness of the film, excellent uniformity (no pores or perforations) and consistency of the film. Spatial atomic layer deposition is an enhanced technology based on traditional atomic layer deposition. On the basis of traditional atomic layer deposition, it changes the time isolation to spatial isolation, by which the deposition rate can be increased by several orders of magnitude, and easier large-area deposition and continuous deposition on substrate can be achieved.

In other implementations, first inorganic layer 131 may be deposited by PLD (Pulsed Laser Deposition), sputtering, PECVD (Plasma Enhanced Chemical Vapor Deposition), and the like.

It can be understood that first inorganic layer 131 is made of inorganic material that increases the barrier properties against water and oxygen, and first inorganic layer 131 is made of a water-proof or water-absorbing material of high relative density, including but not limited to $ZrAl_xO_y$ (zirconium aluminate), graphene, $Al_2O_3$ (alumina), $ZrO_2$ (zirconia), $ZnO_2$ (zinc oxide), $SiN_x$ (silicon nitride), SiCN (silicon carbonitride), SiON (silicon oxynitride) $SiO_x$ (silicon oxide), $TiO_2$ (titanium oxide), DLC (diamond-like carbon), etc. First inorganic layer 131 may be one or a combination of numerous components. The thickness of first inorganic layer 131 may be between 0.5 and 1 um.

In order to match the temperature that organic light-emitting material can withstand, the forming temperature of first inorganic layer 131 is 100° C. or lower. First inorganic layer 131 obtained at the process temperature has more defects, such as small pores. Therefore, the barrier properties against water and oxygen of first inorganic layer 131 obtained at this temperature range is relatively poor.

In the implementation, second inorganic layer 132 is formed on first inorganic layer 131, and second inorganic layer 132 is formed by spatial atomic layer deposition. During the forming process of second inorganic layer 132, second inorganic layer 132 forms a monatomic layer in each cycle, and a plurality of monatomic layers are sequentially laid layer by layer to form second inorganic layer 132, and this ensures precise thickness control and excellent uniformity (no perforations) and consistency of the film. Therefore, the density and uniformity of second inorganic layer 132 are greater than those of second inorganic layer 132, and a denser sealing layer can be formed on first inorganic layer 131, thereby improving the barrier properties against water and oxygen of the encapsulating structure, and improving the reliability of display panel 100.

Optionally, the material of substrate 110 is polyimide. Polyimide has good flexibility, high temperature resistance and water resistance.

Second inorganic layer 132 is made of a water-proof or water-absorbing material of high relative density, including but not limited to $ZrAl_xO_y$ (zirconium aluminate), graphene, Al$_2$O$_3$ (alumina), ZrO$_2$ (zirconia), ZnO$_2$ (zinc oxide), SiN (silicon nitride), SiCN (silicon carbonitride), SiON (silicon oxynitride) SiO$_x$ (silicon oxide), TiO$_2$ (titanium oxide), DLC (diamond-like carbon), etc. First inorganic layer 131 may be one or a combination of numerous components. Preferably, the material of second inorganic layer 132 is Al$_2$O$_3$ (alumina). The material of second inorganic layer 132 may be one or a mixture of numerous components.

In other implementations, second inorganic layer 132 may be covered on light-emitting device 120, and first inorganic layer 131 may be covered on second inorganic layer 132. Second inorganic layer 132 and first inorganic layer 131 form a sealing layer covering light-emitting device 120.

Optionally, second inorganic layer 132 may have a thickness of 0.05-0.1 um. Since second inorganic layer 132 is formed by spatial atomic layer deposition and the thickness of second inorganic layer 132 is much smaller than that of first inorganic layer 131, second inorganic layer 132 may fill the holes and defects in first inorganic layer 131, which has little influence on the thickness of encapsulating structure 130. The thickness of encapsulating structure 130 has a great influence on the flexibility of display panel 100, and the smaller the thickness of encapsulating structure 130 is, the better the flexibility of display panel 100 is. Therefore, second inorganic layer 132 with smaller thickness can reduce the influence on the flexibility the display panel 100, and is beneficial to the use of display panel 100 for the OLED display device.

First inorganic layer 131 is disposed between substrate 110 and second inorganic layer 132 and can protect second inorganic layer 132. Since the thickness of second inorganic layer 132 is relatively thin, when substrate 110 is provided with sharp protrusions, second inorganic layer 132 is highly likely to be punctured by sharp protrusions. But in the case where first inorganic layer 131 is first laid on substrate 110, first inorganic layer 131 may cover the sharp protrusions on substrate 110 to prevent second inorganic layer 132 from being punctured. That is, first inorganic layer 131 can also serve as a protective layer of second inorganic layer 132 while serving as a sealing layer of light-emitting device 120.

The edge of the first inorganic layer disclosed herein exceeds the edge of the second inorganic layer. That is, The projection of second inorganic layer 132 in the plane of the first inorganic layer 131 falls within first inorganic layer 131 so that second inorganic layer 132 completely fits first inorganic layer 131 to avoid second inorganic layer 132 being damaged by foreign materials on substrate 110.

In other implementations, the edge of first inorganic layer 131 coincides with the edge of second inorganic layer 132.

Figure 3:
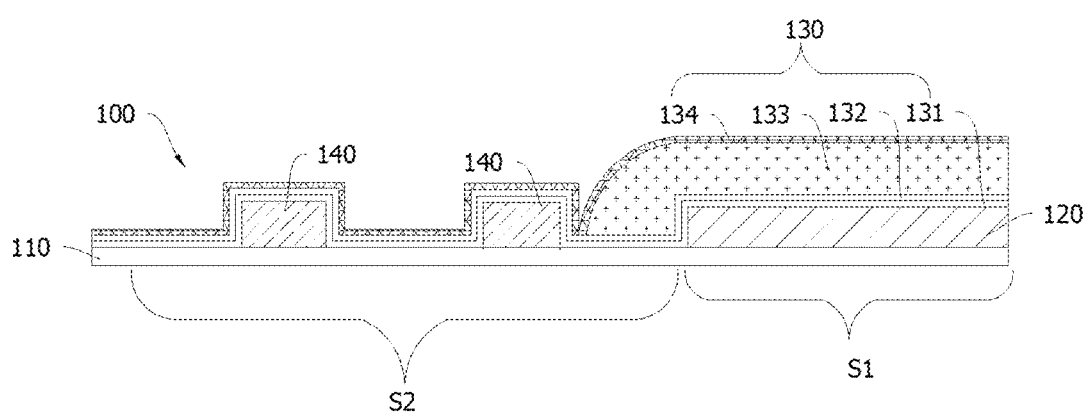
FIG. 3 is a schematic view of a display panel provided by a third implementation of the present invention.

In one implementation, referring to FIG. 3, display panel 100 is a flexible display panel 100, and encapsulating structure 130 further comprises organic buffer layer 133 and third inorganic layer 134 sequentially covering second inorganic layer 132.

Organic buffer layer 133 is used to buffer the stress during the bending of display panel 100, and may also cover particulate contaminants. By providing organic buffer layer 133 in encapsulating structure 130, the flexibility of display panel 100 can be enhanced, which is advantageous for the application of display panel 100 in a flexible display device.

Optionally, organic buffer layer 133 may be formed by IJP (ink jet printing), PECVD (Plasma Enhanced Chemical Vapor Deposition), slot coating, spin-coating, dispensing, or the like. The thickness of organic buffer layer 133 may be between 1 and 20 um. The material of organic buffer layer 133 includes, but is not limited to, one or more components selected from the group consisting of acrylic acid, hexamethyldisiloxane, polyacrylate, polycarbonate, polystyrene, and the like. Organic buffer layer 133 is used to buffer the stress during the bending or folding of display panel 100, and to cover particulate contaminants.

Third inorganic layer 134 disclosed herein is covered on organic buffer layer 133 and the edges of first inorganic layer 131 and third inorganic layer 134 exceed the edge of organic buffer layer 133. On the one hand, organic buffer layer 133 is encapsulated by third inorganic layer 134 and first inorganic layer 131, on the other hand, third inorganic layer 134 may also further function as water barrier and oxygen barrier.

Optionally, the edge of second inorganic layer 132 may exceed the edge of organic buffer layer 133, or coincide with the edge of organic buffer layer 133. Preferably, the edge of second inorganic layer 132 may exceed the edge of organic buffer layer 133, and the edge of organic buffer layer 133 is an inorganic layer, which can prevent the invasion of water and oxygen. The edge of second inorganic layer 132 fits the edge of third inorganic layer 134 to seal organic buffer layer 133 between second inorganic layer 132 and third inorganic layer 134.

In other implementations, the edge of organic buffer layer 133 exceeds the edge of second inorganic layer 132, but does not exceed the edge of first inorganic layer 131, which can buffer the stress at the edge of second inorganic layer 132, prevent breakage at the edge of second inorganic layer 132 during the folding process of display panel 100. Organic buffer layer 133 may be encapsulated by first inorganic layer 131 and third inorganic layer 134.

In one implementation, third inorganic layer 134 is formed by spatial atomic layer deposition. Third inorganic layer 134 with a higher density can prevent organic buffer layer 133 from overflowing through third inorganic layer 134, and can also block water and oxygen.

Third inorganic layer 134 is made of a water-proof or water-absorbing material of high relative density, including but not limited to, ZrAl$_x$O$_y$ (zirconium aluminate), graphene, Al$_2$O$_3$ (alumina), ZrO$_2$ (zirconia), ZnO$_2$ (zinc oxide), SiN (silicon nitride), SiCN (silicon carbonitride), SiON (silicon oxynitride) SiO$_x$ (silicon oxide), TiO$_2$ (titanium oxide), DLC (diamond-like carbon), etc. First inorganic layer 131 may be one or a combination of numerous components. The material of third inorganic layer 134 may be one or a mixture of numerous components.

Optionally, third inorganic layer 134 may have a thickness of 0.05-0.1 um. Since third inorganic layer 134 is formed by spatial atomic layer deposition and the thickness of third inorganic layer 134 is much smaller than that of first inorganic layer 131, third inorganic layer 134 may have little influence on the thickness of encapsulating structure 130. Therefore, third inorganic layer 134 with smaller thickness can reduce the influence on the flexibility the display panel 100, and is beneficial to the use of display panel 100 in an OLED display device.

Optionally, the edge of third inorganic layer 134 may or may not extend beyond the edge of first inorganic layer 131. When the edge of the third inorganic layer 134 does not exceed the edge of first inorganic layer 131, third inorganic layer 134 does not need to fit substrate 110, thus preventing third inorganic layer 134 from being damaged by foreign materials on substrate 110.

Light-emitting device 120 is encapsulated by encapsulating structure 130 in the implementation, and the reliability test is performed. In an environment with a temperature of 60° C. and a humidity of 90%, there are no dark spots and shrinkage of light-emitting area occur for display panel 100 during the continuous display process of 509 hours. Therefore, encapsulating structure 130 in the implementation can have a good barrier effect against water and oxygen on light-emitting device 120, thus improving the reliability of display panel 100.

In other implementations, an inorganic layer formed by chemical vapor deposition may also be disposed between organic buffer layer 133 and third inorganic layer 134. The thickness of the inorganic layer may be between 0.5 and 1 um. The material of the inorganic layer may be at least one of $ZrAl_xO_y$ (zirconium aluminate), graphene, $Al_2O_3$ (alumina), $ZrO_2$ (zirconia), $ZnO_2$ (zinc oxide), $SiN_x$ (silicon nitride), SiCN (silicon carbonitride), SiON (silicon oxynitride) $SiO_x$ (silicon oxide), $TiO_2$ (titanium oxide) and DLC (diamond-like carbon).

Light-emitting device 120 comprises a thin film transistor and an OLED organic light emitting layer.

In another implementation, referring to FIG. 3, display panel 100 further comprises at least one of barrier walls 140 disposed on substrate 110; at least one of barrier walls 140 surrounds light-emitting device 120. Barrier walls 140 are disposed in peripheral area S2.

At least one of barrier walls 140 is covered by first inorganic layer 131, second inorganic layer 132 and third inorganic layer 134. and At least one of barrier walls 140 surrounds organic buffer layer 133, and the edge of organic buffer layer 133 does not exceed a barrier wall 140 of the plurality of barrier walls 140 that is furthest from light-emitting device 120. Barrier wall 140 may define a boundary of organic buffer layer 133 to avoid the problem that organic buffer layer 133 cannot be shaped and may flow anywhere.

In addition, barrier wall 140 can be produced by dispensing or ink-jet printing process. That is, the process of barrier wall 140 is simple, and the production cost can be effectively reduced.

In other implementations, barrier wall 140 may be annular. The number of barrier walls 140 is not limited in the present application. The number of the barrier walls 140 may be one, or may be three, five, or the like.

The material of barrier wall 140 includes, but not limited to, at least one of epoxy resin, polyimide-like, polymethyl methacrylate-like, and silicone-like. Preferably, the material of barrier wall 140 may be polyimide.

In one implementation, the material of barrier wall 140 includes an adhesive and water absorbing particles. The water absorbing particles are mixed in the adhesive so that barrier wall 140 can absorb intrusive water and oxygen to prevent water and oxygen from intruding into light-emitting device 120 when water and oxygen intrude into display panel 100.

Optionally, the material of barrier wall 140 includes, but not limited to, at least one of epoxy resin, polyimide-like, polymethyl methacrylate-like, and silicone-like. The water absorbing particles may have water absorbing function and be in the form of nanoparticles, and have a particle diameter range from several to tens of nanometers. The material of the water absorbing particles may be CaO (calcium oxide), or SrO (yttria), or a mixture thereof.

Figure 4:
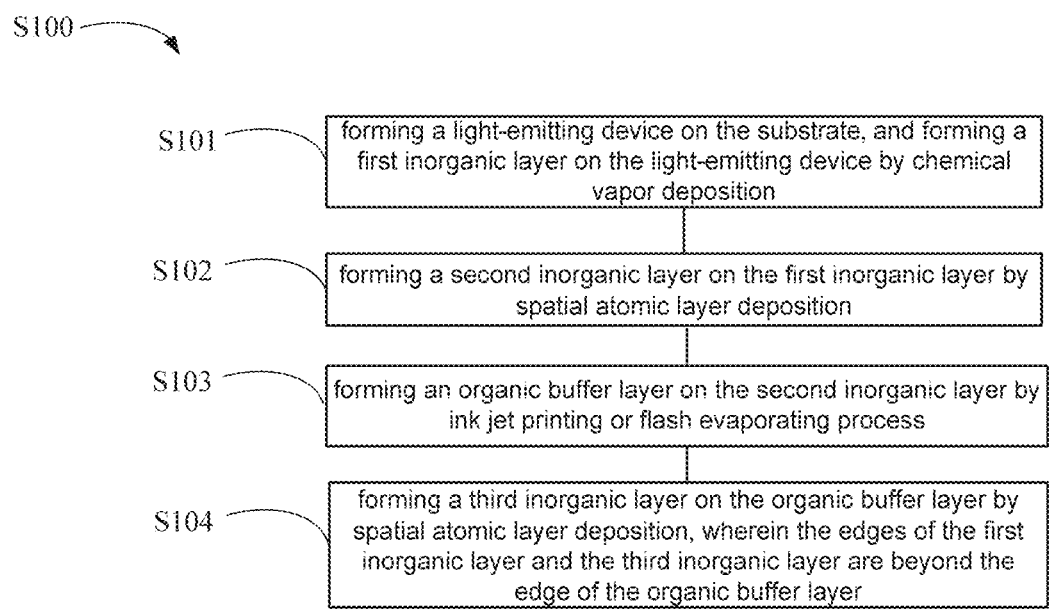
FIG. 4 is a schematic diagram illustrating the process of manufacturing an OLED display panel provided by the present invention.

See FIG. 4. The present application further provides a manufacturing method S100 of a display panel, which is used to prepare display panel 100 according to any of the above implementations. The manufacturing method S100 comprises the following steps of S101, S102, S103 and S104.

S101, light-emitting device 120 is formed on substrate 110, and forming a first inorganic layer 131 is formed on light-emitting device 120 by chemical vapor deposition.

In other implementations, first inorganic layer 131 may be deposited by PLD (Pulsed Laser Deposition), sputtering, PECVD (Plasma Enhanced Chemical Vapor Deposition), and the like.

S102, second inorganic layer 132 is formed on first inorganic layer 131 by spatial atomic layer deposition so that the density of second inorganic layer 132 is larger than that of first inorganic layer 131, so as to improve the barrier properties against water and oxygen of display panel 100.

S103, organic buffer layer 133 is formed on second inorganic layer 132 by ink jet printing or flash evaporating process.

In other implementations, organic buffer layer 133 may be formed by PECVD (Plasma Enhanced Chemical Vapor Deposition), slot coating, spin-coating, dispensing, or the like.

S104, third inorganic layer 134 is formed on organic buffer layer 133 by spatial atomic layer deposition, the edges of first inorganic layer 131 and third inorganic layer 134 exceed the edge of organic buffer layer 133 to encapsulate organic buffer layer 133.

Second inorganic layer 132 is formed on first inorganic layer 131, and second inorganic layer 132 is formed by spatial atomic layer deposition. During the forming process of second inorganic layer 132, second inorganic layer 132 forms a monatomic layer in each cycle, and a plurality of monatomic layers are sequentially laid layer by layer to form second inorganic layer 132, and this ensures precise thickness control and excellent uniformity (no perforations) and consistency of the film. Therefore, the density and uniformity of second inorganic layer 132 are greater than those of second inorganic layer 132, and a denser sealing layer can be formed on first inorganic layer 131, thereby improving the barrier properties against water and oxygen of the encapsulating structure, and improving the reliability of display panel 100.

Finally, it should be noted that the above implementations are only used to illustrate the technical solutions of the present invention without limitation, and ordinary people skilled in the art should understand that modifications or equivalent substitutions can be made on the technical solutions of the present invention without departing from the scope of the technical solutions of the present invention.

What is claimed is:

1. A display panel comprising:
   a substrate,
   a light-emitting device disposed on the substrate,
   a first inorganic layer and a second inorganic layer sequentially covering the light-emitting device;
   wherein the density of the second inorganic layer is larger than that of the first inorganic layer, so as to improve the barrier properties against water and oxygen of the display panel;
   wherein the display panel further comprises an organic buffer layer and a third inorganic layer sequentially covering the second inorganic layer, and the edges of the first inorganic layer and the third inorganic layer exceed the edge of the organic buffer layer.

2. The display panel as claimed in claim 1, wherein the edge of the first inorganic layer exceeds the edge of the second inorganic layer.

3. The display panel as claimed in claim 1, wherein the edge of the second inorganic layer exceeds the edge of the organic buffer layer.

4. The display panel as claimed in claim 1, wherein the edge of the organic buffer layer exceeds the edge of the second inorganic layer.

5. The display panel as claimed in claim 1, wherein the second inorganic layer is an alumina film, and the second inorganic layer has a thickness of 0.05-0.1 um.

6. The display panel as claimed in claim 1, wherein the display panel further comprises at least one of barrier walls disposed on the substrate; at least one of the barrier walls surrounds the light-emitting device; at least one of the barrier walls is covered by the first inorganic layer, the second inorganic layer and the third inorganic layer, and at least one of the barrier walls surrounds the organic buffer layer.

7. The display panel as claimed in claim 1, wherein the first inorganic layer fits the substrate so that the light-emitting device is sealed between the first inorganic layer and the substrate.

8. A manufacturing method of a display panel comprising:
 forming a light-emitting device on a substrate, and forming a first inorganic layer on the light-emitting device by chemical vapor deposition;
 forming a second inorganic layer on the first inorganic layer by spatial atomic layer deposition so that the density of the second inorganic layer is larger than that of the first inorganic layer, so as to improve the barrier properties against water and oxygen of the display panel;
 forming an organic buffer layer on the second inorganic layer by ink jet printing or flash evaporating process;
 forming a third inorganic layer on the organic buffer layer by spatial atomic layer deposition, wherein the edges of the first inorganic layer and the third inorganic layer exceed the edge of the organic buffer layer to encapsulate the organic buffer layer.

\* \* \* \* \*